United States Patent
Fujii

(10) Patent No.: US 9,245,954 B2
(45) Date of Patent: Jan. 26, 2016

(54) SEMICONDUCTOR DEVICE AND PRODUCTION METHOD THEREOF

(71) Applicant: NEW JAPAN RADIO CO., LTD., Tokyo (JP)

(72) Inventor: Yoshio Fujii, Tokyo (JP)

(73) Assignee: NEW JAPAN RADIO CO., LTD., Tokyo (JP)

( * ) Notice: Subject to any disclaimer, the term of this patent is extended or adjusted under 35 U.S.C. 154(b) by 72 days.

(21) Appl. No.: 13/692,101

(22) Filed: Dec. 3, 2012

(65) Prior Publication Data

US 2013/0306985 A1 Nov. 21, 2013

(30) Foreign Application Priority Data

May 17, 2012 (JP) ................................. 2012-113619

(51) Int. Cl.
*H01L 29/40* (2006.01)
*H01L 29/16* (2006.01)
*H01L 21/02* (2006.01)
*H01L 23/00* (2006.01)

(52) U.S. Cl.
CPC ....... *H01L 29/1608* (2013.01); *H01L 21/02697* (2013.01); *H01L 24/05* (2013.01); *H01L 24/48* (2013.01); *H01L 24/45* (2013.01); *H01L 2224/02166* (2013.01); *H01L 2224/04042* (2013.01); *H01L 2224/05624* (2013.01); *H01L 2224/32245* (2013.01); *H01L 2224/45015* (2013.01); *H01L 2224/45124* (2013.01);
(Continued)

(58) Field of Classification Search
CPC ......... H01L 24/08; H01L 24/42; H01L 24/47; H01L 24/48; H01L 2224/04042; H01L 2224/05124

USPC .......... 257/765, 771, 784, E21.509, E21.518; 438/617, 614, 615
See application file for complete search history.

(56) References Cited

U.S. PATENT DOCUMENTS 7,338,889 B2    3/2008  Akram
2002/0190395 A1*  12/2002  Fang et al. .................... 257/784
2004/0171246 A1*  9/2004  Akram .......................... 438/612
(Continued)

FOREIGN PATENT DOCUMENTS

JP          H6-260538           9/1994

OTHER PUBLICATIONS

D. Siepe, et al.; "The Future of Wire Bonding is? Wire Bonding!;" CIPS 2010; Mar. 16-18, 2010, Nuremberg/Germany; Paper 3.7; 4 Sheets/p. 1 of specification.
Chinese Office Action for Chinese Patent Application 201210558689.0 issued on Jul. 31, 2015.

*Primary Examiner* — Kimberly Rizkallah
*Assistant Examiner* — Maria Ligai
(74) *Attorney, Agent, or Firm* — Kratz, Quintos & Hanson, LLP

(57) ABSTRACT

An aluminum material can be used on a surface of the electrode of a semiconductor element, this aluminum layer need not be formed thick unnecessarily, a copper wire is bonded strongly to the semiconductor element irrespective of a diameter of the wire, and high heat resistance can be achieved. Silicon carbide (SiC) is used as a substrate of the semiconductor element 10, the titanium layer 20 and the aluminum layer 21 are formed as the electrode 15 on the silicon carbide substrate, and by a ball bonding or a wedge bonding of the copper wire 16 to the aluminum layer 21 of the electrode 15 while applying ultrasonic wave, the copper-aluminum compound layer 23 ($Al_4Cu_9$, AlCu or the like) is formed between the copper wire 16 and the titanium layer 20.

3 Claims, 3 Drawing Sheets

(52) U.S. Cl.
CPC ............. *H01L2224/45147* (2013.01); *H01L 2224/4847* (2013.01); *H01L 2224/48247* (2013.01); *H01L 2224/48458* (2013.01); *H01L 2224/48472* (2013.01); *H01L 2224/73265* (2013.01); *H01L 2924/10272* (2013.01)

(56) References Cited

U.S. PATENT DOCUMENTS

2008/0073792 A1* 3/2008 Hosseini et al. ............... 257/762
2012/0273954 A1* 11/2012 Higgins, III ................... 257/762

* cited by examiner

SEMICONDUCTOR DEVICE AND PRODUCTION METHOD THEREOF

TECHNICAL FIELD

The present invention relates to a semiconductor device and a production method thereof, particularly a semiconductor device and a production method thereof, in which wire bonding is carried out using a copper wire on a power semiconductor element or the like.

BACKGROUND OF THE INVENTION

In semiconductor devices, wiring between a semiconductor element (chip) and a lead wire or a circuit substrate has been carried out by wire bonding using an aluminum (Al) wire, and an aluminum wire is connected to an aluminum or gold material formed on a surface of an electrode of the semiconductor element.

For power sources of, for example, domestic electric appliances, OA equipment, audio apparatuses, etc., power semiconductor devices (for power control) such as diodes and transistors are used, and also in these power semiconductor devices, an aluminum wire is used as a metallic wire for wire bonding due to demands for a high-voltage current and cost reduction as shown in, for example, JP 6-260538 A.

On the other hand, recently wire bonding using a copper wire which is advantageous from the viewpoint of thermal conductivity, electric conductivity, etc. has been proposed as shown in CIPS 2010, Mar. 16-18, 2010, Nuremberg/Germany—Paper 3.7, in which a copper wire is connected to an aluminum or copper material formed on a surface of an electrode of a semiconductor element. Generally there are a small diameter copper wire and a large diameter copper wire. In the case of a small diameter copper wire, one having a diameter of less than 75 µm is used for wiring by ball bonding technology, and an aluminum material is used on a surface of an electrode of a semiconductor element. In the case of a large diameter copper wire, one having a diameter of not less than 75 µm is used for wiring by wedge bonding technology, and a copper material is used on a surface of an electrode of a semiconductor element.

SUMMARY OF THE INVENTION

However, in ball bonding technology using a copper wire having a small diameter of less than 75 µm, there is a case where a damage is given to a substrate of a semiconductor element due to a shock at the ball bonding, and in conventional technology, in order to decrease the damage on the semiconductor element, an aluminum layer is formed thick on an electrode on a substrate of the semiconductor, which is disadvantageous since a material cost required is increased.

Meanwhile, in the case of the above-mentioned high-output power semiconductor devices, an output thereof depends on a diameter of a copper wire, and a copper wire having a large diameter is required. As mentioned above, a copper wire having a large diameter of 75 µm or more can be bonded and connected to an electrode by wedge bonding technology. However, in conventional wedge bonding technology, only bonding of the same materials has been reported, and in order to conduct bonding of a copper wire, it is necessary to use a copper material on a surface of an electrode of a semiconductor element.

However, generally in many of conventional semiconductor elements, an aluminum material has been used on a surface of an electrode, and in order to use a copper material on a surface of an electrode of a semiconductor element, there is a problem that many modifications of existing equipment are required.

Further, it is demanded that in the connection of a copper wire to an electrode of a semiconductor device, bonding strongly withstanding to many heat cycles should be conducted irrespective of a diameter of the wire.

The present invention has been made in the light of the above-mentioned problems, and the object of the present invention is to provide a semiconductor device and a production method thereof, in which even in the case of using a copper wire having a large diameter as a bonding material, an aluminum material can be used on a surface of an electrode of a semiconductor element, a thickness of the aluminum layer need not to be thick unnecessarily, and a copper wire can be strongly bonded to the electrode of the semiconductor element irrespective of a diameter of a wire, thereby assuring that strong bonding can be obtained in heat cycles between a low temperature and a high temperature.

In order to achieve the above-mentioned object, the present invention is characterized in that in a semiconductor device, in which an aluminum layer is formed on a surface (uppermost surface) of an electrode of a semiconductor element and wire bonding of a copper wire to the electrode is conducted, a compound layer comprising copper and aluminum (a copper-aluminum compound layer) is formed between the copper wire and a metal layer which is a layer provided under the aluminum layer of the electrode.

The compound may comprise at least one selected from the group consisting of $Al_2Cu_3$, $Al_4Cu_9$, $AlCu_3$ or $AlCu_4$ (so-called a copper-rich copper-aluminum compound). Namely, a compound comprising any one of them or two or more of them is formed.

Titanium may be used as the metal for the metal layer under the aluminum layer of the electrode.

Silicon carbide (SiC) may be used as a substrate of the semiconductor element.

A production method of a semiconductor device of the present invention is characterized in that in the method for producing a semiconductor device comprising forming an aluminum layer on a surface of an electrode of a semiconductor element and connecting a copper wire to the electrode, the copper wire is subjected to wire bonding on the aluminum layer of the electrode while applying ultrasonic vibration and a compound layer comprising copper and aluminum (a copper-aluminum compound layer) is formed between the copper wire and a metal layer which is a layer provided under the aluminum layer of the electrode.

According to the above-mentioned configuration, for example, the titanium layer is formed as an electrode on the substrate of the semiconductor element, and a 10 µm thick aluminum layer is formed on the titanium layer. By wire bonding (ball bonding or wedge bonding technology) of the copper wire to the aluminum layer while applying ultrasonic wave, a thin (metallic) compound layer including copper and aluminum is formed between the copper wire and the titanium layer (metal layer under the aluminum layer of the electrode). Namely, by a reaction of copper of the copper wire with aluminum on the electrode surface, the copper-rich copper-aluminum compound layer comprising $Al_2Cu_3$, $Al_4Cu_9$, $AlCu_3$, $AlCu_4$ or the like or an AlCu layer is formed between the copper wire and the titanium layer.

EFFECT OF THE INVENTION

According to the semiconductor device of the present invention and the production method thereof, an aluminum material can be used as a surface layer of the electrode of the semiconductor element in the same manner as in conventional device, and a manufacturing equipment for a conventional semiconductor element, in which the aluminum layer is formed on the surface of the electrode, can be used as it is, and therefore, no large-scale modification of equipment is necessary even in the case of a copper wire.

Further, due to the presence of a relatively hard copper-aluminum compound layer, the copper wire is connected strongly to the semiconductor element irrespective of a diameter of the wire, and as compared with the case where pure aluminum is present between the copper wire and the titanium layer, there are effects such that the progress of disconnection (breaking) of a bonded portion and neighbors thereof due to power cycle (heat cycle) fatigue of the semiconductor device can be prevented satisfactorily and high reliability of junction portion can be achieved.

Furthermore, by the use of titanium as a metal layer provided under the aluminum layer and silicon carbide as a substrate of the semiconductor element, there is an effect such that the aluminum layer need not be formed thick unnecessarily on a surface of the electrode. Namely, since titanium and silicon carbide are hard materials, a damage to be given on the semiconductor element and its electrode at the wire bonding is small. Therefore, the thickness of the aluminum layer on the surface of the electrode may be from several micrometers to about ten micrometers, and it is not necessary to form the aluminum layer thick on the surface of the electrode in the same manner as in a conventional device for decreasing the damage.

DETAILED DESCRIPTION

Figure 1:
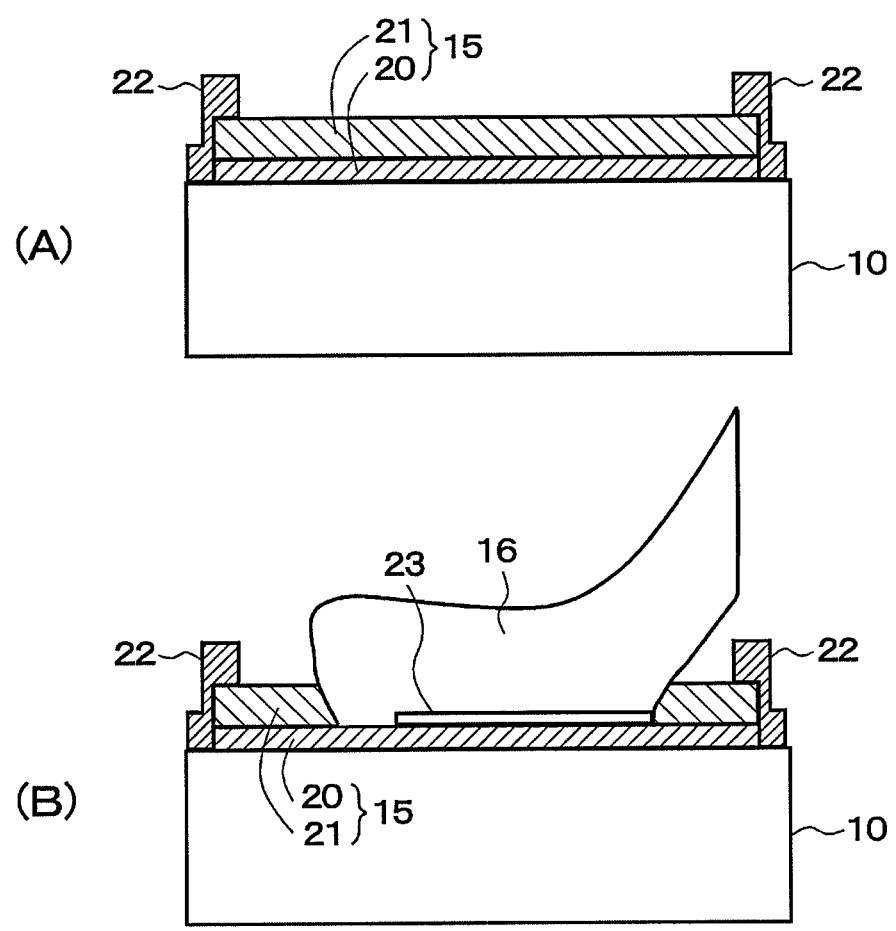
FIG. 1 shows the configuration of the connection portion of the copper wire to the electrode of the power semiconductor device according to an Example of the present invention. (A) is a partial cross-sectional view before the connection of the copper wire, and (B) is a partial cross-sectional view after the connection of the copper wire.
Figure 2:
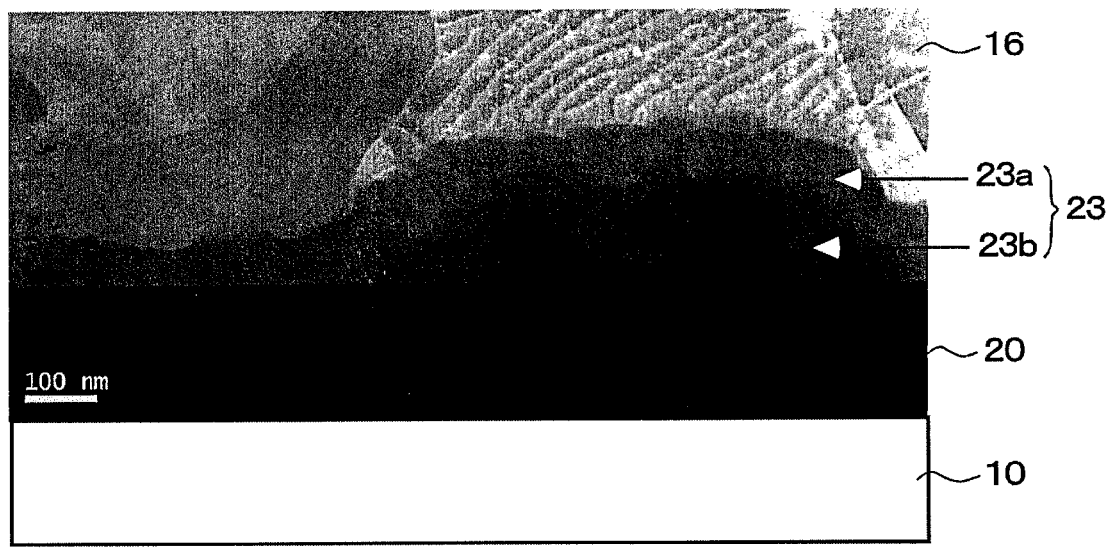
FIG. 2 is a photograph showing the result of identification of the copper-aluminum compound layer at the connection portion of the copper wire to the electrode of the power semiconductor device according to the Example.
Figure 3:
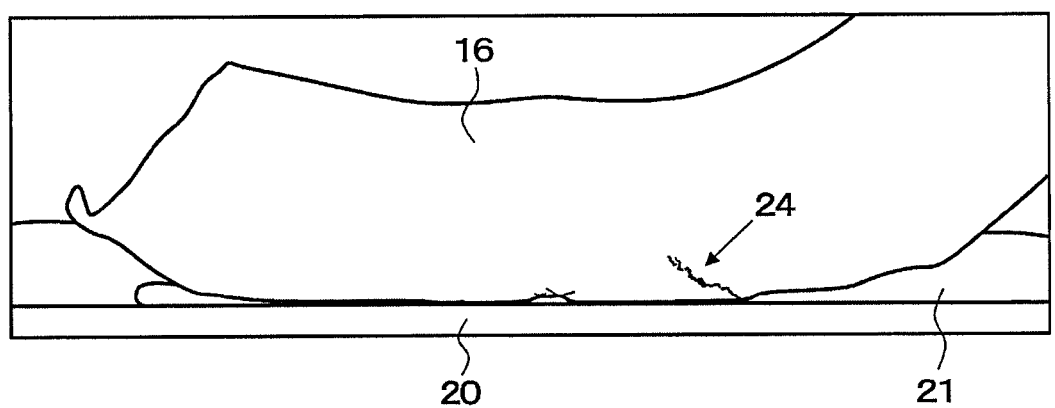
FIG. 3 is a cross-sectional view showing a state of the connection portion of the copper wire to the electrode after a heat cycle test in the configuration of the Example.
Figure 4:
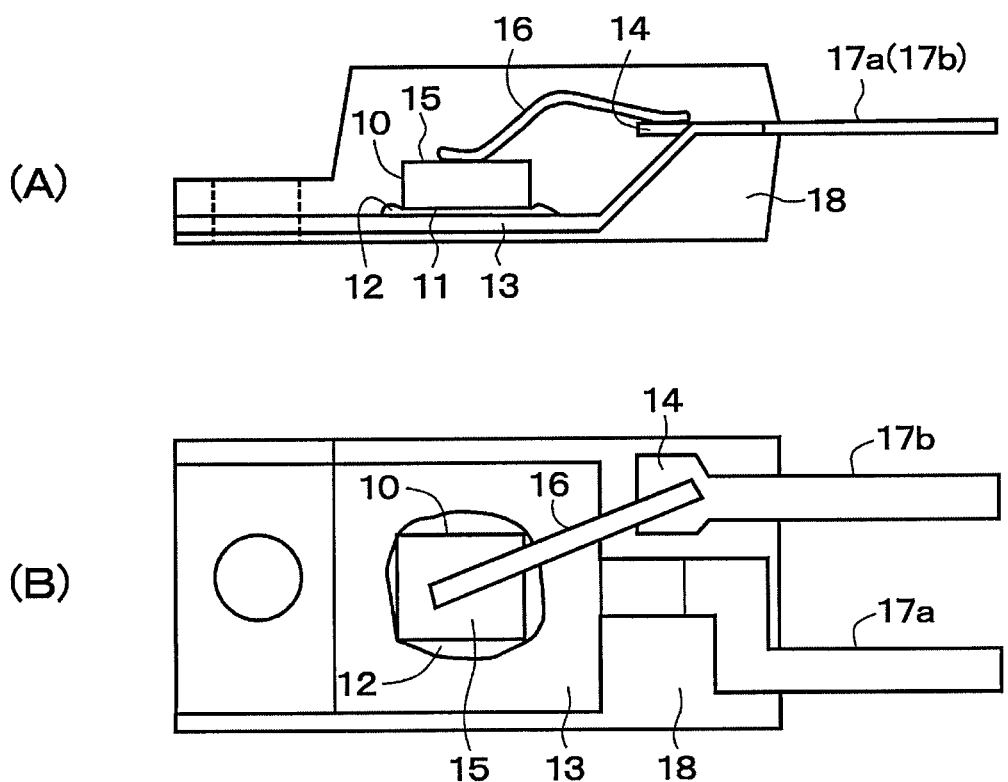
FIG. 4 shows the configuration of the power semiconductor device (diode) according to the Example. (A) is a perspective side view of the resin package, and (B) is a perspective plan view of the resin package.

FIGS. 1 to 3 show the configuration of the connection portion of the copper wire to the electrode of the power semiconductor device (for example, diode) according to the Example of the present invention, and FIG. 4 shows the configuration of the power semiconductor device. In the power semiconductor device of FIG. 4, a bottom side electrode (cathode) 11 of a power semiconductor element 10 is bonded to a metallic lead frame 13 by means of solder 12, and an inner lead portion 14 of the metallic lead frame 13 is connected to a top side electrode (anode) 15 of the power semiconductor element 10 by using a copper wire 16. Further, to the metallic lead frame 13 is connected an external electrode 17a made of the same material, and to the inner lead portion 14 is connected an external electrode 17b made of the same material. The whole power semiconductor element 10 is molded with a resin 18.

In FIG. 1(A), silicon carbide (SiC) is used as a substrate of the power semiconductor element 10. On this silicon carbide substrate is formed a titanium layer 20 having a thickness of several micrometers as the top side electrode 15, and on the titanium layer 20 is formed an aluminum layer 21 having a thickness of from several micrometers to about ten micrometers. Further, a protective film 22 made of polyimide or the like is provided around the electrode 15.

Then, by wire bonding of the copper wire 16 to the aluminum layer 21, as shown in FIG. 1(B), a copper-aluminum compound layer (alloy layer: a compound or alloy layer comprising copper and aluminum) 23 is formed between the copper wire 16 and the titanium layer 20. Namely, in the Example of the present invention, by carrying out a wedge bonding with applying ultrasonic vibration and a pressure, the copper-aluminum compound layer 23 can be formed on a bottom surface of the copper wire 16 while the aluminum layer 21 is scraped out. It is possible to form the copper-aluminum compound layer 23 by carrying out a ball bonding with applying ultrasonic vibration (and heat and pressure) instead of the above-mentioned wedge bonding. As shown in FIG. 1(B), it is not always necessary to form the copper-aluminum compound layer 23 over the whole jointing surface, and the copper-aluminum compound layer 23 may be formed to such an extent to enable the desired bonding strength to be kept. For example, in the case of conducting the wedge bonding, the copper-aluminum compound layer 23 is formed on a portion pressed by a capillary.

In FIG. 2, the result of the identification of the copper-aluminum compound layer 23 (observation of diffraction pattern by nano electron beam) is shown. According to FIG. 2, it is seen that $Al_4Cu_9$ portion 23a and AlCu portion 23b are formed and disposed as the copper-aluminum compound layer 23 between the copper wire 16 and the titanium layer 20.

FIG. 3 shows a state of the connection portion of the copper wire 16 to the electrode after the heat cycle test in the Example. In the test where 5000 cycles were conducted at a heat cycle between −65° C. and 150° C., no breaking of the connection portion of the copper wire 16 occurred. In the case of pure aluminum layer, strength for breaking is low, and it is known that when connecting an aluminum wire to an aluminum layer of an electrode in the same manner as in conventional wire bonding, disconnection (breaking) occurs at about 3000 cycles in the case of a heat cycle between −65° C. and 150° C., and this breaking is propagated from an end of the connection portion. On the contrary, in the Example of the present invention, as shown in FIG. 3, crack 24 occurs only within a range of ⅓ of a thickness of a bonding portion of the wire after the test of 5000 cycles.

Namely, by forming the copper-rich copper-aluminum compound layer 23 such as $Al_4Cu_9$ portion 23a having high strength between the copper wire 16 and the titanium layer 20 (wire connecting portion) but not forming a pure aluminum layer, the copper wire 16 is strongly bonded to the electrode 15. Examples of other copper-rich copper-aluminum compound layer 23 are $Al_2Cu_3$, $AlCu_3$, $AlCu_4$, and the like. Formation of one of or a plurality of these relatively hard compounds enables strong connection of the copper wire 16.

In the Example of the present invention, since the hard titanium layer 20 is provided under the aluminum layer 21 and hard silicon carbide is used as the substrate of the power semiconductor element 10, a damage to be given on the power semiconductor element 10 at the wire bonding with applying ultrasonic vibration is small. Therefore, the thickness of the aluminum layer 21 on the surface of the electrode 15 may be from several micrometers to about ten micrometers, and it is not necessary to increase an amount of aluminum for decreasing the damage.

In the Example of the present invention, since the copper wire 16 having a diameter of 75 μm or more can be easily bonded strongly by the wedge bonding, there is an advantage such that good properties such as high heat resistance can be obtained in power semiconductor devices using a large diameter copper wire, and value in use is high.

In the Example of the present invention, though the titanium layer 20 was used as a metal layer under the aluminum layer 21, a copper layer or the like also may be used instead of the titanium layer. Further, while silicon carbide was used as a substrate of the semiconductor element 10, gallium nitride (GaN), silicon, diamond and the like can be used instead of silicon carbide.

EXPLANATION OF SYMBOLS

10 Power semiconductor element
11 Bottom side electrode
13 Metallic lead frame
14 Inner lead portion
15 Top side electrode
16 Copper wire
20 Titanium layer
21 Aluminum layer
23 Copper-aluminum compound layer
23a $Al_4Cu_9$ portion
23b AlCu portion

What is claimed is:

1. A semiconductor device having a connecting structure in which a copper wire is connected to an electrode part of a semiconductor element by wire bonding, wherein
    the electrode part has a metal layer formed directly on a semiconductor layer and an aluminum layer laminated on the metal layer,
    a part of aluminum in a wire bonding part is removed by the wire bonding of the copper wire to the electrode part, and the copper wire is bonded to the metal layer via a compound layer comprising copper and aluminum and directly contacting the metal layer, wherein titanium is used as the metal layer, wherein silicon carbide is used as a substrate of the semiconductor element.

2. The semiconductor device of claim 1, wherein the compound layer comprises at least one selected from the group consisting of $Al_2Cu_3$, $Al_4Cu_9$, $AlCu_3$ and $AlCu_4$.

3. A method for producing a semiconductor device having a connecting structure in which a copper wire is connected to an electrode part of a semiconductor element by wire bonding, comprising:
    forming an electrode part by forming a metal layer directly on a semiconductor layer and laminating an aluminum layer on the metal layer, and
    forming a compound layer comprising copper and aluminum while scraping out a part of the aluminum layer between the copper wire and the metal layer by the wire bonding of the copper wire on the aluminum layer of the electrode part while applying ultrasonic vibration, and bonding the copper wire to the metal layer via the compound layer such that the compound layer directly contacts the metal layer, wherein titanium is used as the metal layer, wherein silicon carbide is used as a substrate of the semiconductor element.

* * * * *